(12) United States Patent
Freund et al.

(10) Patent No.: US 6,384,612 B2
(45) Date of Patent: *May 7, 2002

(54) METHOD AND APPARATUS FOR TESTING THE LIGHT OUTPUT OF LIGHT EMITTING DEVICES

(75) Inventors: Joseph M. Freund, Fogelsville; George J. Przybylek, Douglasville; Dennis M. Romero, Allentown; John Stayt, Jr., Schnecksville, all of PA (US)

(73) Assignee: Agere Systems Guardian Corporation, Miami Lakes, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/168,035

(22) Filed: Oct. 7, 1998

(51) Int. Cl.[7] .................................. G01R 1/04
(52) U.S. Cl. ....................... 324/750; 324/753
(58) Field of Search ............... 324/750, 751, 324/753, 766, 71.3, 96, 765; 438/14–18; 257/40, 48; 250/310, 311

(56) References Cited

U.S. PATENT DOCUMENTS 4,775,640 A * 10/1988 Chan ........................ 324/758
5,381,103 A * 1/1995 Edmond et al. ............ 324/753

\* cited by examiner

Primary Examiner—Vinh P. Nguyen
(74) Attorney, Agent, or Firm—Darby & Darby

(57) ABSTRACT

A method for testing the light emitted by a group of semiconductor light emitting devices arranged to emit light over a testing area, each light emitting device having a p-contact, the method including connecting a plurality of selectively connectable p-contact probes to the p-contacts of respective light emitting devices in the group of light emitting devices, selectively activating one of the light emitting devices in the group of light emitting devices to emit light over the testing area by selectively supplying a predetermined electrical current to the p-contact of the selected light emitting device via its respective p-contact probe, guiding the light emitted by the selected light emitting device via a light funnel having a collection end and a detection end, the collection end being in juxtaposition with all the light emitting devices in the group of light emitting devices, and detecting light exiting the detection end of the light funnel.

12 Claims, 5 Drawing Sheets

METHOD AND APPARATUS FOR TESTING THE LIGHT OUTPUT OF LIGHT EMITTING DEVICES

FIELD OF THE INVENTION

The present invention relates to testing of semiconductor light emitting devices, more particularly, the invention relates to a method and apparatus for collecting light from a linear array of edge emitting semiconductor laser or LED devices.

BACKGROUND OF THE INVENTION

Semiconductor light emitting devices, e.g., edge emitting laser diodes or light emitting diodes (LED), are well known in the art. Such devices are manufactured on wafers which, after initial manufacture and processing (e.g. thinning down and trimming), are separated into a predetermined number (e.g., three) of smaller units, generally referred to as wafer sections. These sections are typically further trimmed in one dimension, generally referred to as length, to a predetermined size. Semiconductor laser or LED bars are produced from a semiconductor wafer section by a scribing and cleaving procedure, wherein predefined shapes of bars are delineated by scribing lines and the bars are separated by cleaving along the scribing lines. Accurate cleaving along the scribed lines is possible because of the brittle nature of the sections.

A typical semiconductor LED or laser bar includes a p-contact surface, generally referred to as the top surface, and an n-contact surface, generally referred to as the back surface. The p-contacts and n-contacts are produced by a fabrication sequence including a metallization process in which the surfaces of a semiconductor wafer are selectively coated with a metallic layer. Individual semiconductor laser or LED devices on the bars may be activated by applying an electric current across the n-contacts and p-contacts, respectively, of the devices. During processing, the bars are typically supported by a flexible, adhesive, holding surface. After processing, the bars may be removed from the holding surface for testing or the devices may be tested while the bars are attached to the holding surface.

Testing of edge emitting semiconductor lasers or LEDs involves measurement of the light intensity emitted by the laser or LED devices at a predefined wavelength spectrum, while applying a predetermined current using electrical probes, namely, a p-contact probe and an n-contact probe. To ensure accurate comparative testing of the laser or LED devices, the light emitted by the devices must be collected at a precise, reproducible manner, e.g., at a predefined distance or angle, and delivered to a light detector using appropriate optics. Typically, a plurality of laser or LED devices are included in each semiconductor bar. To test individual laser or LED devices along the bar, the light detector and associated optics, as well as the p-side electrical probe, must be separately aligned for each device being tested. For reliable comparative testing of the laser or LED devices, the p-contact alignment procedure requires complex and tedious positioning equipment and/or software to ensure consistency in collecting and detecting the light emitted by the laser or LED devices. The n-contact does not require realignment for each device being tested because the semiconductor bar includes a common n-contact for all the laser or LPD devices thereon.

SUMMARY OF THE INVENTION

The present inventors have developed a method and apparatus for testing light emission from a series of edge emitting semiconductor laser diodes or LEDs, using a light collection arrangement and a p-contact electrical probe, without requiring movement and/or realignment of the laser or LED bar, the light collection arrangement or the p-contact electrical probe.

In accordance with the present invention, the light emitted by individual laser or LED devices along a laser or LED bar is collected sequentially by a fixed funnel-shaped light guide (hereinafter referred to as: "light funnel") which directs the light emitted by the individual laser or LED devices to a light detector. In accordance with an aspect of the present invention, a series of laser or LED bars, which may be mounted on a holding substrate, may be sequentially brought to a predefined position aligned with the light funnel. A selectively activated electrical probe arrangement, including a plurality of individually addressable p-contact probes, is brought into contact with the laser or LED bar, such that each p-contact probe is in contact with a respective p-contact. A switching device may be used to selectively apply biasing voltage to the to the individual laser or LED devices along the bar, via the respective p-contact probes, and the light emitted by each individual laser or LED device is collected by the fixed light funnel. Thus, once the laser or LED bar is appropriately positioned with respect to the light funnel, and the p-contact probe arrangement is brought into contact with the respective p-contacts of the bar, the relative physical positions of the bar, the flight funnel and the p-contact probe arrangement remain fixed during testing of all the laser or LED devices on the bar.

An embodiment of the present invention thus provides apparatus for sequentially testing the light emitted by a group of semiconductor light emitting devices, each device having a p-contact, arranged to emit light over a testing area. The apparatus includes a light detector and a light funnel which has a collection end, constructed to capture light over substantially the entire testing area, and a detection end. The detection collects light emitted by any of the light emitting devices and the detection end directs the collected light to the light detector. The apparatus further includes an electrical probe arrangement including a plurality of p-contact probes which are selectively connectable with the p-contacts of respective light emitting devices in the group of light emitting devices. The apparatus may further include a support device for securely positioning the group of semiconductor light emitting devices aligned with the collection end of the light funnel. Additionally, the apparatus may include a switching device for selectively supplying a predetermined electrical current, via the p-contact probes, to the p-contacts of selected ones of the light emitting devices.

The present invention also provided a method for sequentially testing the light emitted by a group of semiconductor light emitting devices, each light emitting device having a p-contact, arranged to emit light over a testing area. The method includes placing an electrical probe arrangement including a plurality of p-contact probes in contact with the p-contact of respective light emitting devices in the group of light emitting devices, selectively activating selected ones of the light emitting devices in the group of light emitting devices to emit light over the testing area, guiding the light emitted by the selectively activated light emitting devices via a light funnel which captures light substantially over the entire testing area, and detecting the light guided by the light funnel. In an embodiment of the present invention, the light emitting devices are selectively activated by selectively supplying an electrical current to the p-contacts of the selected light emitting devices via their respective p-contact probes. The group of semiconductor light emitting devices are preferably securely positioned at a fixed position with respect to the collection end of the light funnel.

BRIEF DESCRIPTION OF THE DRAWINGS

The present invention will be understood and appreciated more fully from the following detailed description of an embodiment of the invention, taken in conjunction with the accompanying drawings in which.

DETAILED DESCRIPTION OF THE PREFERRED EMBODIMENTS

The present invention will be hereinafter described in the context of testing the light output of edge emitting semiconductor laser devices. It should be understood however, that the invention is also suitable for testing the light output of other light emitting devices, for example, light emitting diode (LED) devices.

Figure 1:
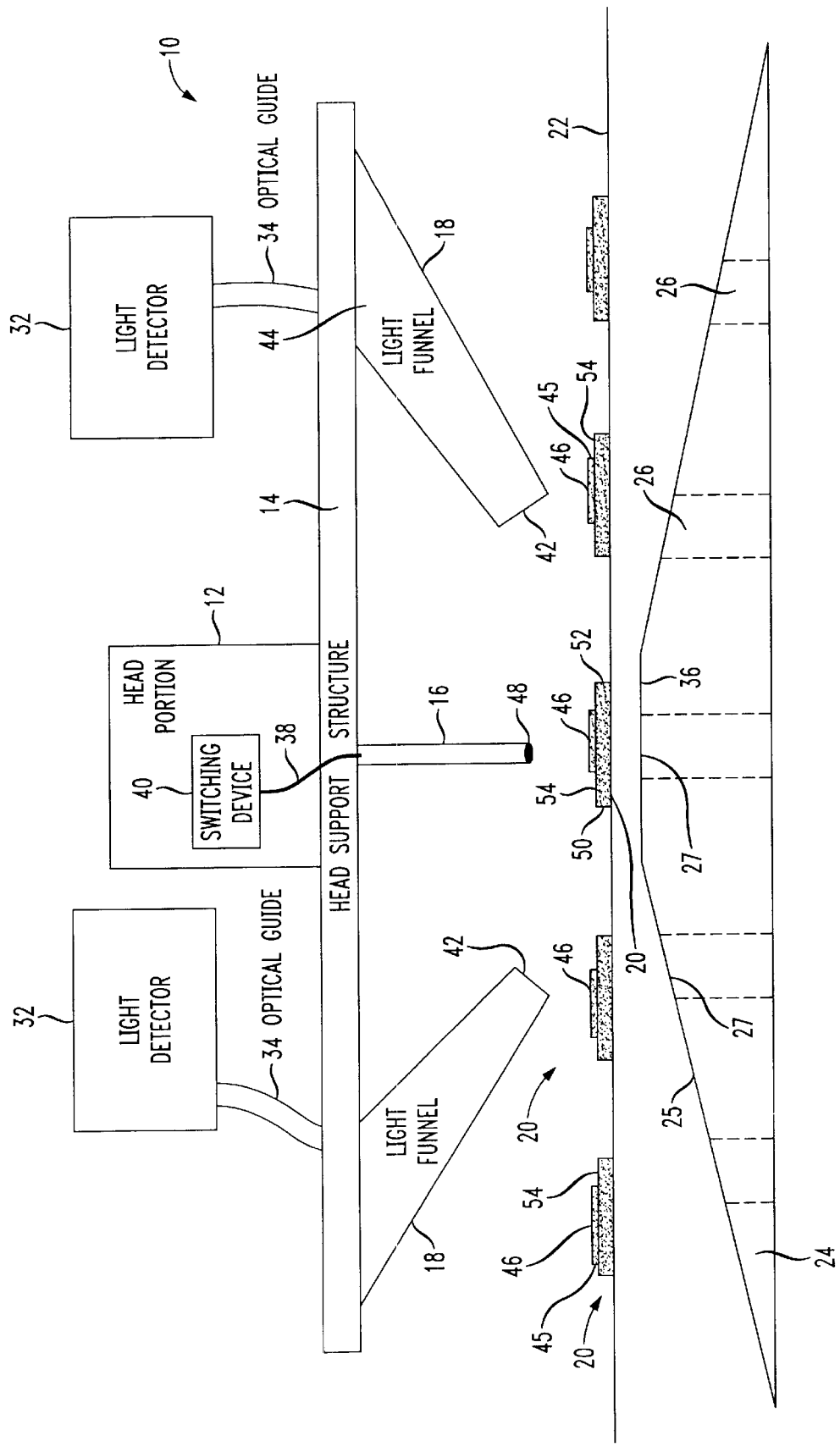
FIG. 1 is a schematic front view of a semiconductor laser or LED testing apparatus in accordance with an embodiment of the present invention, shown in preparation for testing in accordance with the present invention.
Figure 2:
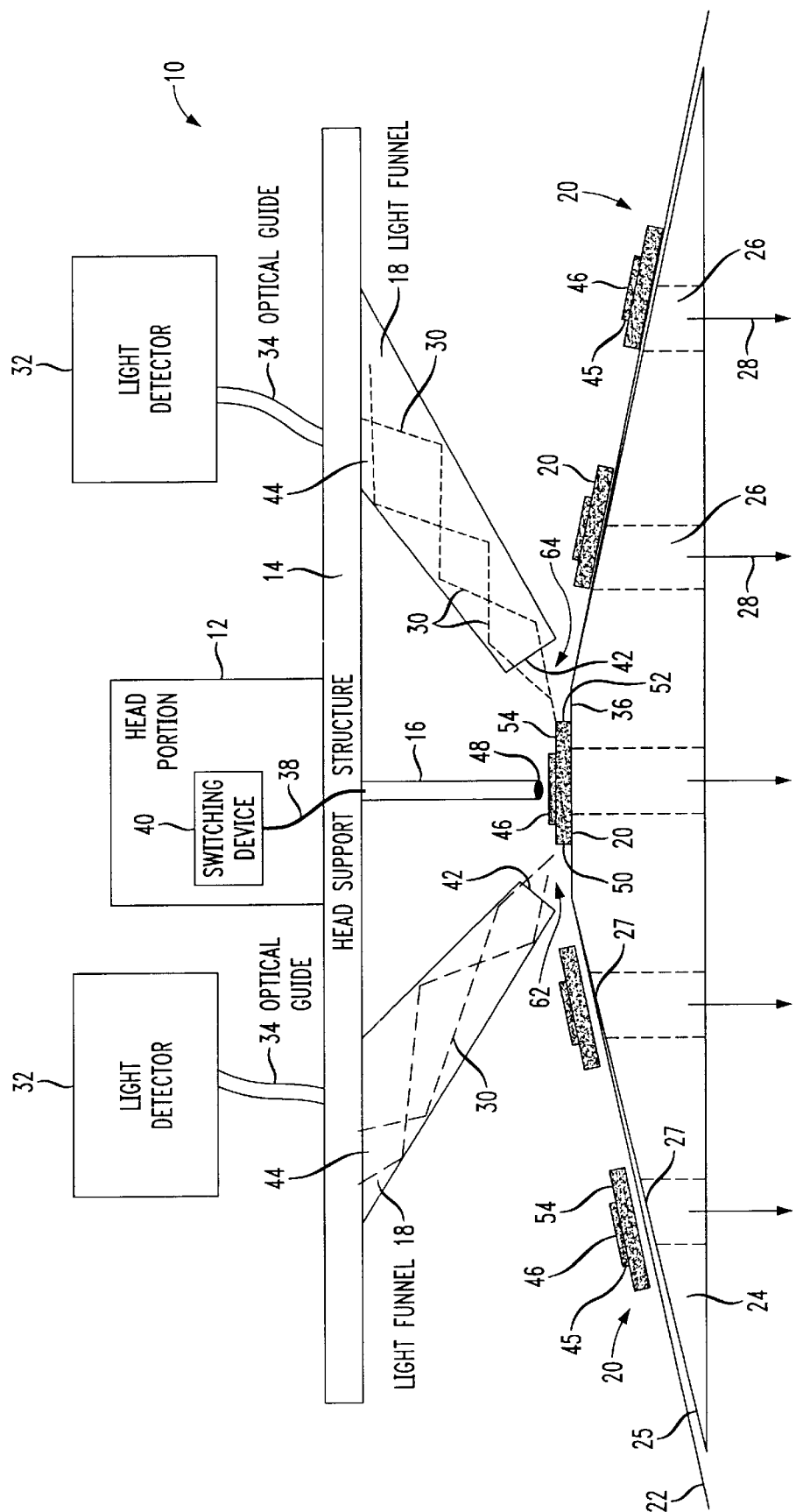
FIG. 2 is a schematic front view of the semiconductor laser or LED testing apparatus of FIG. 1, during testing of semiconductor laser or LED devices in accordance with an embodiment of the present invention.
Figure 3:
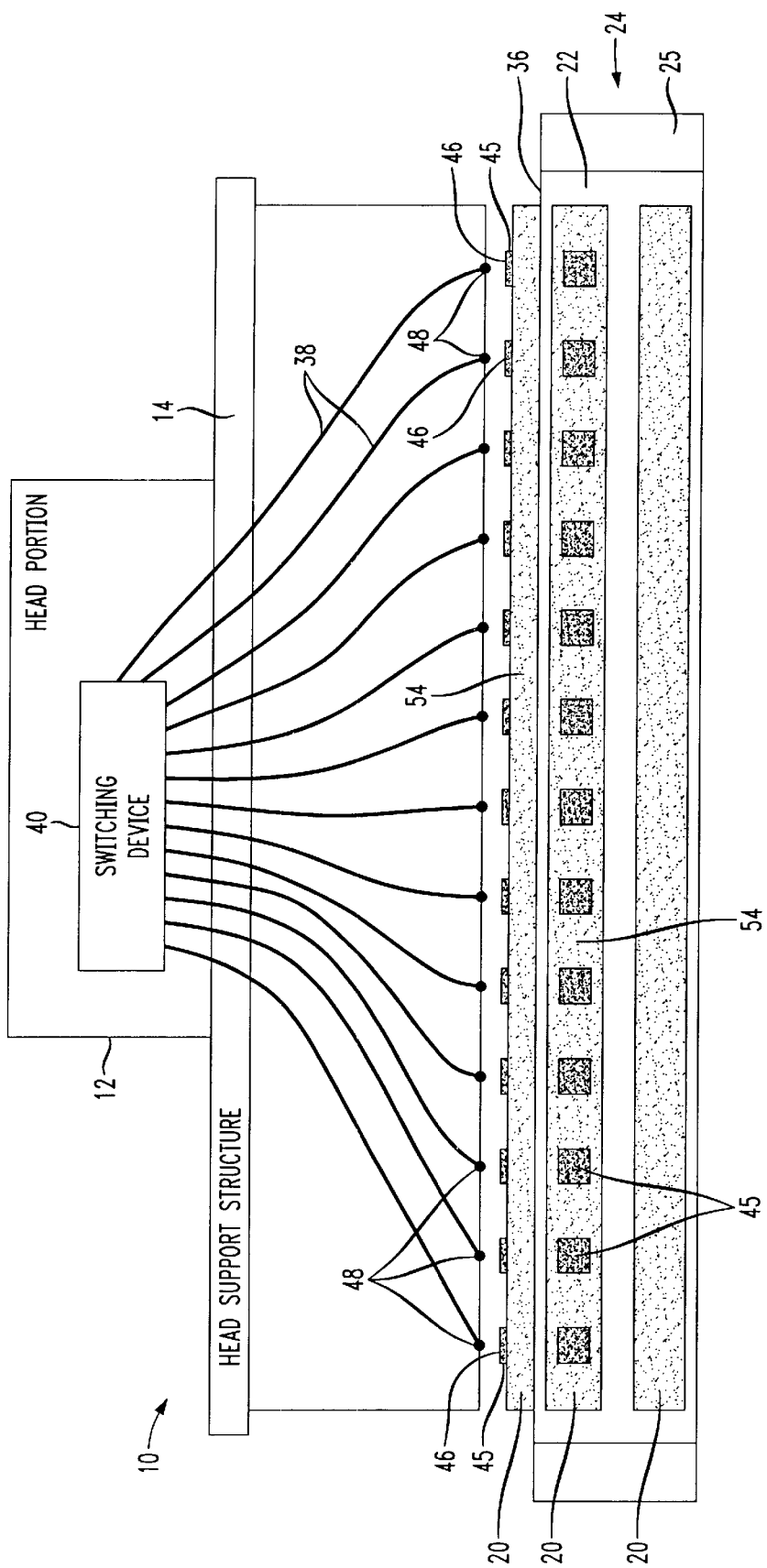
FIG. 3 is a schematic side view of part of the semiconductor laser or LED testing apparatus of FIG. 1, during testing of semiconductor laser or LED devices in accordance with an embodiment of the present invention.

Reference is made to FIG. 1 which schematically illustrates a front view of a testing apparatus in accordance with an embodiment of the present invention, and to FIGS. 2 and 3 which schematically illustrate a front view and a side view respectively, of the testing apparatus of FIG. 1 during testing in accordance with an embodiment of the present invention. The testing apparatus includes a testing assembly 10 having a head portion 12, a head support structure 14 and two light funnels 18, each having a light collection end 42 and a detection end 44. As shown particularly in FIG. 3, head assembly 10 also includes an electrical probe arrangement 16 including a plurality of separately addressable p-contact electrical probes 48, as described in detail below.

The testing apparatus further includes a test sample support device 24 having a surface 25 for supporting a holding substrate 22, e.g., an adhesive film. A plurality of semiconductor laser bars 20, each having opposite edges 50 and 52 and a top surface 54, are mounted on substrate 22 such that top surface 54 faces testing assembly 10. As shown particularly in FIG. 3, each semiconductor bar 20 includes a series of semiconductor laser devices 45 having p-contacts 46 on top surface 54. Each laser device 45, when activated, emits light through edges 50 and 52 of bar 20. Support device 24 may include a plurality of vacuum suction channels 26 which extend through the support device and have suction apertures 27 at surface 25.

As shown particularly in FIGS. 1 and 2, surface 25 may include a generally level region 36 directly underneath probe arrangement 16. Region 36 is adapted for placing one of laser bars 20 at a desired position relative to probe arrangement 16 and light funnels 18, for testing as described below. Surface 25 is slanted downwardly and outwardly on either side of region 36, such that the laser bars 20 not being tested will not block or reflect the light emitted by the laser devices 45 on the laser bar 20 being tested.

Testing assembly 10 further includes a switching device 40 which is electrically connected, via conductors 38, to p-contact probes 48 in probe arrangement 16. Testing assembly 10 further includes two light detectors 32 which are optically coupled to detection ends 44 of respective light funnels 18, via optical guides 34 which may include optical fibers and/or lenses as are known in the art.

As shown in FIG. 2, during operation, a vacuum is produced in channels 26, e.g., by a vacuum suction pump (not shown in the drawings), in the direction indicated by arrows 28. The vacuum suction produced at apertures 27, pulls substrate 22 towards surface 25 conforming the shape of flexible substrate 22 to the shape of surface 25. The vacuum at apertures 27 also ensures that substrate 22 is securely mounted on surface 25. In an embodiment of the present invention, before suction is applied to channels 26, substrate 22 is positioned on surface 25, using suitable alignment means, for example, precision X-Y-Z Axis servo stages, as is known in the art, such that the laser bar 20 to be tested is correctly positioned on region 36 underneath testing assembly 10.

Once the bar 20 to be tested is positioned on region 36, testing assembly 10 may be lowered, using any suitable mechanical means known in the art, until probe arrangement 16 is brought into contact with the bar 20 being tested, as shown particularly in FIG. 3. At this point, contact is made between the plurality of electrical probes 48 of arrangement 16 and respective p-contacts 46 of laser devices 45 on surface 54 of bar 20. Alternatively, probe arrangement 16 may be brought into contact with the bar 20 being tested by raising support device 24. Using switching device 40, which may be controlled by suitable hardware or software known in the art, a predetermined bias current is selectively applied to p-contacts 46 of selected ones of laser devices 45. Switching device 40 preferably supplies a bias current in a predetermined bandwidth suitable for activating the laser devices, as is known in the art, and includes an electrostatic discharge (ESD) protection circuit for protecting the laser devices from potentially damaging ESD. The n-contacts to laser devices 45 are provided via a common n-contact on the bottom surface of bar 20, as is known in the art, which may be continuously connected to a predetermined electric potential. In this manner, laser devices 45 may be sequentially activated to emit light via edges 50 and 52 of bar 20 over testing areas 62 and 64, respectively, alongside collection ends 42 of light funnels 18.

As shown in FIG. 2, light 30 emitted from edges 50 and 52, over testing areas 62 and 64, is collected by collecting ends 42 of respective light funnels 18 which carry the light, via respective detection ends 44 and optical guides 34, to light detectors 32. Light detectors 32 monitor the intensity of light emitted from edges 50 and 52, respectively, of each of sequentially tested laser devices 45. Thus, the present invention enables reliable comparative testing of different laser devices 45 as well as comparative testing between the emissions from edges 50 and 52 for each tested laser device 45. Any suitable method and apparatus may be used to analyze the laser or LED emissions of edges 50 and 52, as detected by light detectors 32, for example, the method and apparatus described in U.S. Pat. No. 4,795,976 to Pawlik, the disclosure of which is incorporated herein by reference.

Figure 4:
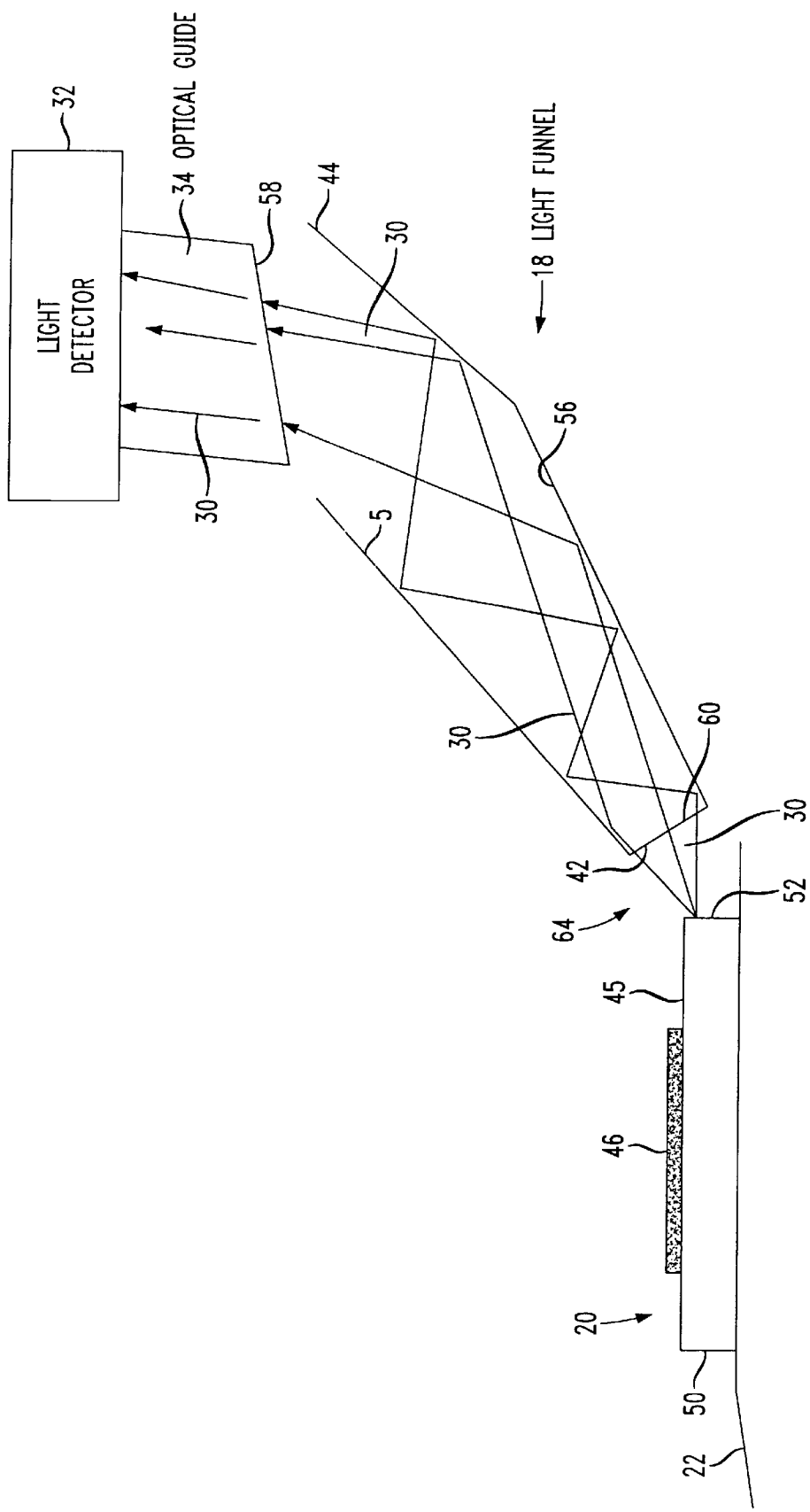
FIG. 4 is a schematic, cross-sectional, front view of part of the testing apparatus of FIG. 1, showing a light funnel aligned with a selectively activated edge emitting laser or LED bar, in accordance with an embodiment of the present invention.
Figure 5:
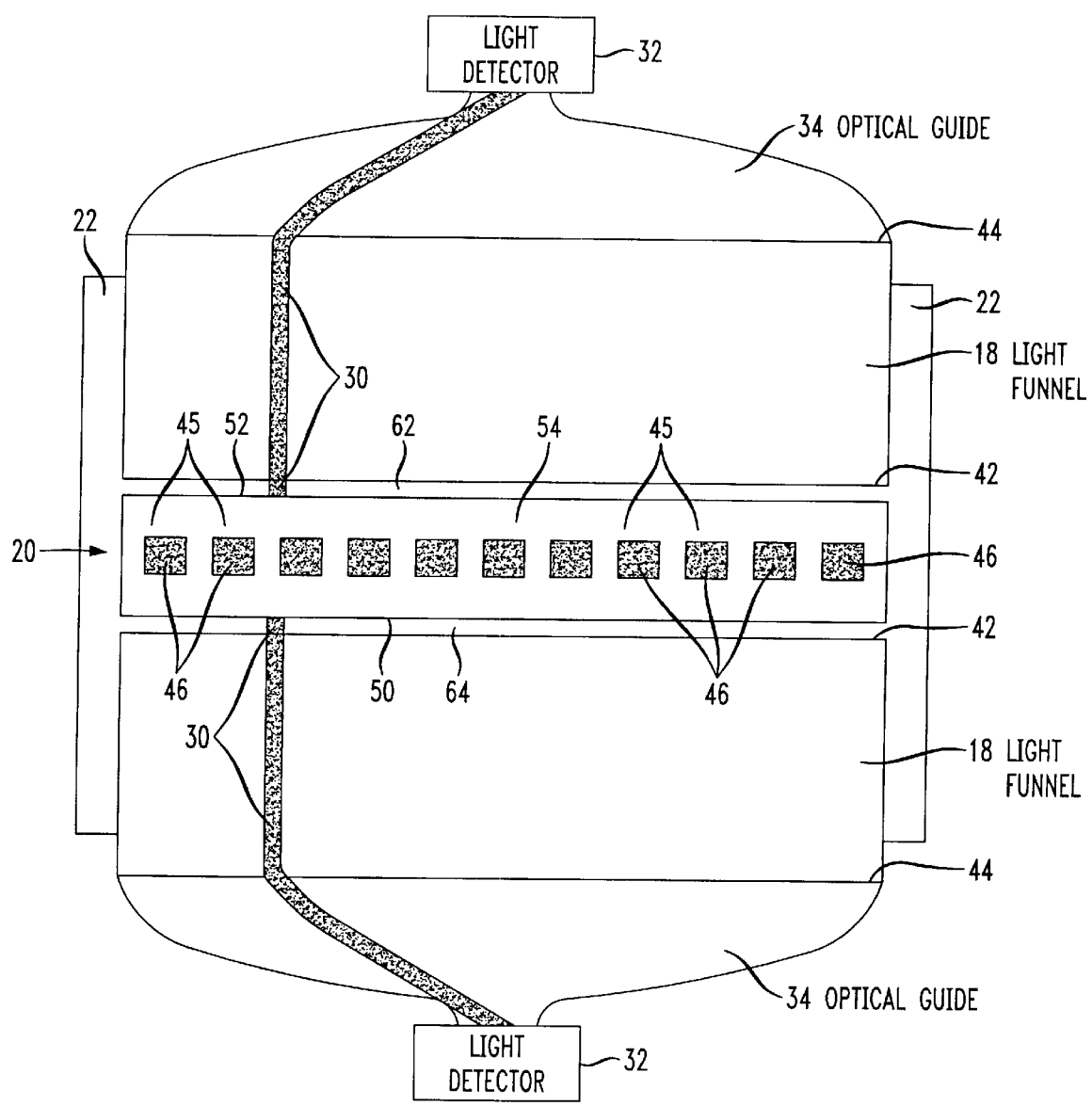
FIG. 5 is a schematic top view of part of the testing apparatus of FIG. 1, showing two light funnels aligned with respective edges of a selectively activated edge emitting laser bar, in accordance with an embodiment of the present invention.

Reference is now made to FIGS. 4 and 5. FIG. 4 schematically illustrates a cross-sectional front view of one of light funnels 18 juxtaposed edge 52 of one of laser bars 20, during activation of one of laser devices 45 by switching apparatus 40 to emit light over testing area 64. FIG. 5 schematically illustrates a top view of light funnels 18 aligned with respective edges 50 and 52 of bar 20, during activation of one of laser devices 45. As shown particularly in FIG. 4, the light 30 emitted via edge 52 over testing area 64 is receives via a front surface 60 of collection end 42 and is carried by multiple reflection off inner surfaces 56 of light funnel 18 to detection end 44. The geometry of light funnel 18 may be designed such that the beam of light 30 exiting detection end 44 will be a generally parallel light beam. The beam of light 30 exiting detection end 44 enters optical guide 34, via an input surface 58, and is carried by the optical guide to light detector 32, as described above. In an embodiment of the present invention, front surface 60 of funnel 18 and input surface 58 of optical guide 58 are slightly angled to prevent direct reflection of light 30 off inner surfaces 56 of light funnel 18 and to ensure that a maximum, consistent, portion of light 30 will reach detector 32.

Light funnel 18 can be made of any suitable light guiding material, such as glass or optical fiber, which may be shaped, using shaping methods for optical fibers known in the art, to have the funnel shape shown in FIG. 4. Alternatively, light funnel 18 may include a hollow tube having polished surfaces 56, or a tube filled with a highly light-transmissive fluid having a predetermined index of refraction. It should be appreciated that the specific geometry of light funnel 18 may depend on the materials composition of the funnel as well as the geometry of other parts of the testing apparatus. To obtain maximum reflection of light 30, surfaces 56 of light funnel 18 are preferably polished and coated with a highly reflective coating, for example, a gold or "pure white" coating.

It will be appreciated by persons skilled in the art that positioning light funnels 18 in juxtaposition with the entire length of edges 50 and 52 of bar 20, for sequentially testing all the laser devices 45 on bar 20 over testing areas 62 and 64, respectively, enables efficient, reliable, testing of a large number of laser devices. This testing arrangement is shown most clearly in FIG. 5.

While certain specific embodiments of the invention are disclosed as typical, the invention is not limited to these particular forms, but rather is applicable broadly to all such variations as fall within the scope of the appended claims. Many modifications and adaptations will be apparent to those skilled in the art to which the invention pertains. Thus, the specific structures and methods discussed in detail above are merely illustrative of specific embodiments of the invention.

What is claimed:

1. Apparatus for testing the light emitted by any one of a series of semiconductor light emitting devices arranged on a substrate at fixed positions relative to each other, each light emitting device having an activation contact, a top surface, a bottom surface and at least one side emission edge, the apparatus comprising:

a light detector;

a light funnel having a collection end adapted to interface one at a time with the side emission edges of all of said light emitting devices in the series of light emitting devices, thereby to collect light emitted by any one of the light emitting devices, and a detection end adapted to direct the light collected by the light funnel to the light detector; and an electrical probe arrangement including a plurality of activation probes, each activation probe adapted to be electrically connected to the activation contact of a respective light emitting device in the series of light emitting devices.

2. Apparatus according to claim 1 and further comprising a support device for securely positioning the group of semiconductor light emitting devices aligned with the collection end of the light funnel.

3. Apparatus according to claim 2 wherein said support device comprises a support surface having a plurality of vacuum suction apertures adapted to temporarily and securely hold a substrate bearing a semiconductor bar including said series of light emitting devices.

4. Apparatus according to claim 2 and further comprising a switching device for selectively supplying a predetermined current, via the activation probes, to the activation contacts of selected ones of the light emitting devices.

5. Apparatus according to claim 2 wherein the group of semiconductor light emitting devices comprises a group of edge emitting laser devices on a semiconductor bar, each laser device having a light emitting edge along a given edge of the semiconductor bar, and wherein the light collecting end of the light funnel is constructed to be placed in juxtaposition with substantially the entire edge of the semiconductor bar.

6. Apparatus according to claim 2 wherein the group of semiconductor light emitting devices comprises a group of edge emitting LED devices on a semiconductor bar, each LED device having a light emitting edge along a given edge of the semiconductor bar, and wherein the light collecting end of the light funnel is constructed to be placed in juxtaposition with substantially the entire edge of the semiconductor bar.

7. Apparatus according to claim 1 and further comprising a switching device for selectively supplying a predetermined current, via the activation probes, to the activation contacts of selected ones of the light emitting devices.

8. Apparatus according to claim 7 wherein the group of semiconductor light emitting devices comprises a group of edge emitting laser devices on a semiconductor bar, each laser device having a light emitting edge along a given edge of the semiconductor bar, and wherein the light collecting end of the light funnel is constructed to be placed in juxtaposition with substantially the entire edge of the semiconductor bar.

9. Apparatus according to claim 7 wherein the group of semiconductor light emitting devices comprises a group of edge emitting LED devices on a semiconductor bar, each LED device having a light emitting edge along a given edge of the semiconductor bar, and wherein the light collecting end of the light funnel is constructed to be placed in juxtaposition with substantially the entire edge of the semiconductor bar.

10. Apparatus according to claim 1 wherein the group of semiconductor light emitting devices comprises a group of edge emitting laser devices on a semiconductor bar, each laser device having a light emitting edge along a given edge of the semiconductor bar, and wherein the light collecting end of the light funnel is constructed to be placed in juxtaposition with substantially the entire edge of the semiconductor bar.

11. Apparatus according to claim 1 wherein the group of semiconductor light emitting devices comprises a group of edge emitting LED devices on a semiconductor bar, each LED device having a light emitting edge along a given edge of the semiconductor bar, and wherein the light collecting end of the light funnel is constructed to be placed in juxtaposition with substantially the entire edge of the semiconductor bar.

12. A method for testing the light emitted by any one of a series of semiconductor light emitting devices arranged on a substrate at fixed positions relative to each other, each light emitting device having an activation contact, a top surface, a bottom surface and at least one side emission edge, comprising the steps of:

connecting a plurality of activation probes to the activation contacts of respective light emitting devices in the series of light emitting devices;

selectively activating individual light emitting devices in the series of light emitting devices to emit light, by separately supplying a predetermined electrical current to the activation contact of each of the selected light emitting devices via their respective activation probes;

guiding the light emitted by said selectively activated light emitting devices via a light funnel having a collection end, adapted to interface one at a time with the side emission edges of all of said light emitting devices in the series of light emitting devices, and a detection end; and detecting light exiting the detection end of the light funnel.

* * * * *